US011551995B2

(12) United States Patent
Woods et al.

(10) Patent No.: US 11,551,995 B2
(45) Date of Patent: Jan. 10, 2023

(54) SUBSTRATE WITH EMBEDDED ACTIVE THERMOELECTRIC COOLER

(71) Applicant: Qorvo US, Inc., Greensboro, NC (US)

(72) Inventors: Mark C. Woods, Richardson, TX (US); Kelly M. Lear, Longwood, FL (US); Deepukumar M. Nair, Lake Mary, FL (US); Tarak A. Railkar, Plano, TX (US); Bradford Nelson, Redwood City, CA (US)

(73) Assignee: Qorvo US, Inc., Greensboro, NC (US)

( * ) Notice: Subject to any disclaimer, the term of this patent is extended or adjusted under 35 U.S.C. 154(b) by 122 days.

(21) Appl. No.: 16/160,442

(22) Filed: Oct. 15, 2018

(65) Prior Publication Data

US 2019/0131209 A1 May 2, 2019

Related U.S. Application Data

(60) Provisional application No. 62/577,490, filed on Oct. 26, 2017.

(51) Int. Cl.
| | |
|---|---|
| *H01L 23/38* | (2006.01) |
| *H01L 23/13* | (2006.01) |
| *H01L 35/08* | (2006.01) |
| *H01L 35/32* | (2006.01) |
| *H01L 23/498* | (2006.01) |

(52) U.S. Cl.
CPC .............. *H01L 23/38* (2013.01); *H01L 23/13* (2013.01); *H01L 23/49827* (2013.01); *H01L 35/08* (2013.01); *H01L 35/32* (2013.01)

(58) Field of Classification Search
CPC .... H01L 23/38; H01L 23/49827; H01L 23/13
See application file for complete search history.

(56) References Cited

U.S. PATENT DOCUMENTS

| | | | |
|---|---|---|---|
| 6,424,533 B1 * | 7/2002 | Chu ..................... | H01L 23/38 |
| | | | 257/930 |
| 7,236,368 B2 * | 6/2007 | Maxwell .............. | H05K 1/0203 |
| | | | 257/722 |

(Continued)

OTHER PUBLICATIONS

Barletta, Phil, et al., "Highly Integrated Thermoelectric Coolers," IEEE Intersociety Conference on Thermal and Thermomechanical Phenomena in Electronic Systems, Las Vegas, Nevada, 2016, pp. 1477-1481.

(Continued)

*Primary Examiner* — Devina Pillay
(74) *Attorney, Agent, or Firm* — Withrow & Terranova, P.L.L.C.

(57) ABSTRACT

The present disclosure relates to a substrate that includes a substrate body and a thermoelectric cooler embedded in the substrate body. The thermoelectric cooler includes a top-side plate with an element-contact pad and a bottom-side plate. The element-contact pad is on a top surface of the top-side plate, which faces a same direction as a top surface of the substrate body and is exposed to the external space of the substrate body. The bottom-side plate is below the top-side plate and close to a bottom surface of the top-side plate. Herein, the element-contact pad is configured to accommodate attachment of a heat-generating electrical element. The top-side plate is configured to change temperature of the heat-generating electrical element, and the bottom-side plate is configured to transfer heat to or absorb heat from the bottom surface of the substrate body.

24 Claims, 7 Drawing Sheets

(56) References Cited

U.S. PATENT DOCUMENTS

| | | | | |
|---|---|---|---|---|
| 2005/0126184 A1* | 6/2005 | Cauchy | ............... | H01L 35/32 |
| | | | | 62/3.3 |
| 2006/0219286 A1* | 10/2006 | Kuroyanagi | ............ | H01L 35/30 |
| | | | | 136/230 |
| 2008/0276624 A1* | 11/2008 | Morimoto | ............... | H01L 35/28 |
| | | | | 62/3.7 |
| 2009/0095513 A1* | 4/2009 | Oshika | ................... | H01L 24/83 |
| | | | | 174/257 |
| 2010/0127299 A1* | 5/2010 | Smith | ...................... | F21K 9/00 |
| | | | | 257/99 |
| 2018/0226515 A1* | 8/2018 | Skeete | ............. | H01L 27/14636 |
| 2020/0006617 A1* | 1/2020 | Ogawa | .................. | H01L 23/36 |

OTHER PUBLICATIONS

Peskovatskii, S. A., et al., "Ultra-Stable Peltier-Cooled Low-Noise 3-mm-Wave-Band Receiver," Fourth International Kharkov Symposium on Physics and Engineering of Millimeter and Sub-Millimeter Waves, vol. 2, Kharkov, Ukraine, Jun. 2001, pp. 738-740.

Yuruker, Sevket, et al., "Integration of Micro-contact Enhanced Thermoelectric Cooler with a FEEDS Manifold-Microchanel System for Cooling of High Flux Electronics," IEEE Intersociety Conference on Thermal and Thermomechanical Phenomena in Electronic Systems, Orlando, Florida, 2017, pp. 711-718.

Substantive Examination Adverse Report for Malaysia Patent Application No. PI 2018001797, dated Jun. 29, 2022, 3 pages.

\* cited by examiner

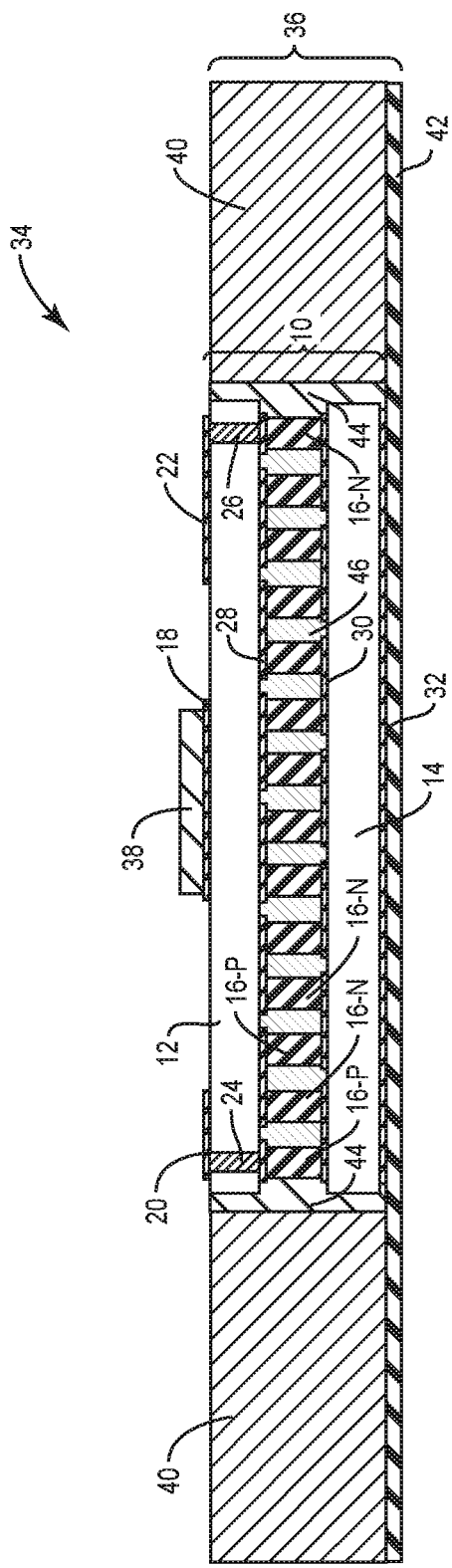
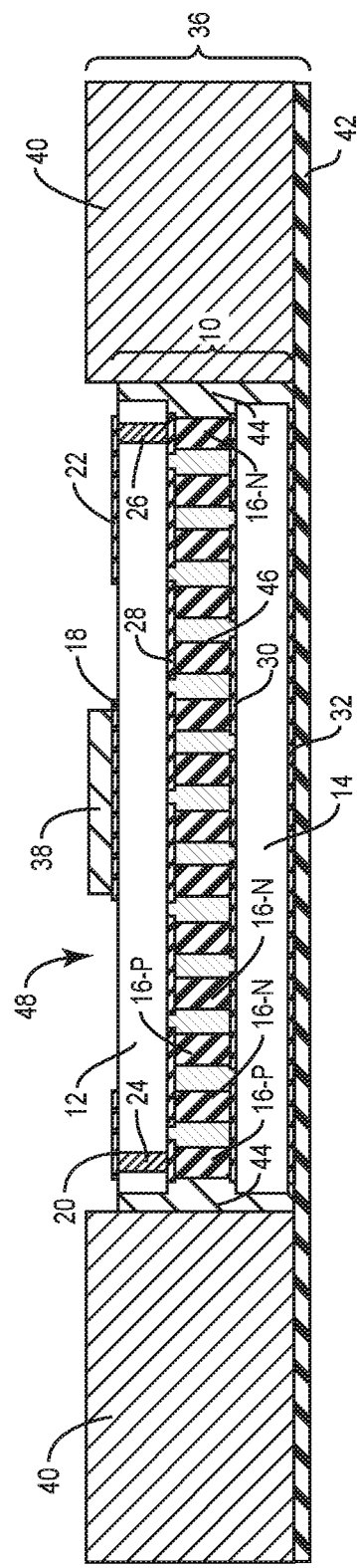
FIG. 2A
FIG. 2B

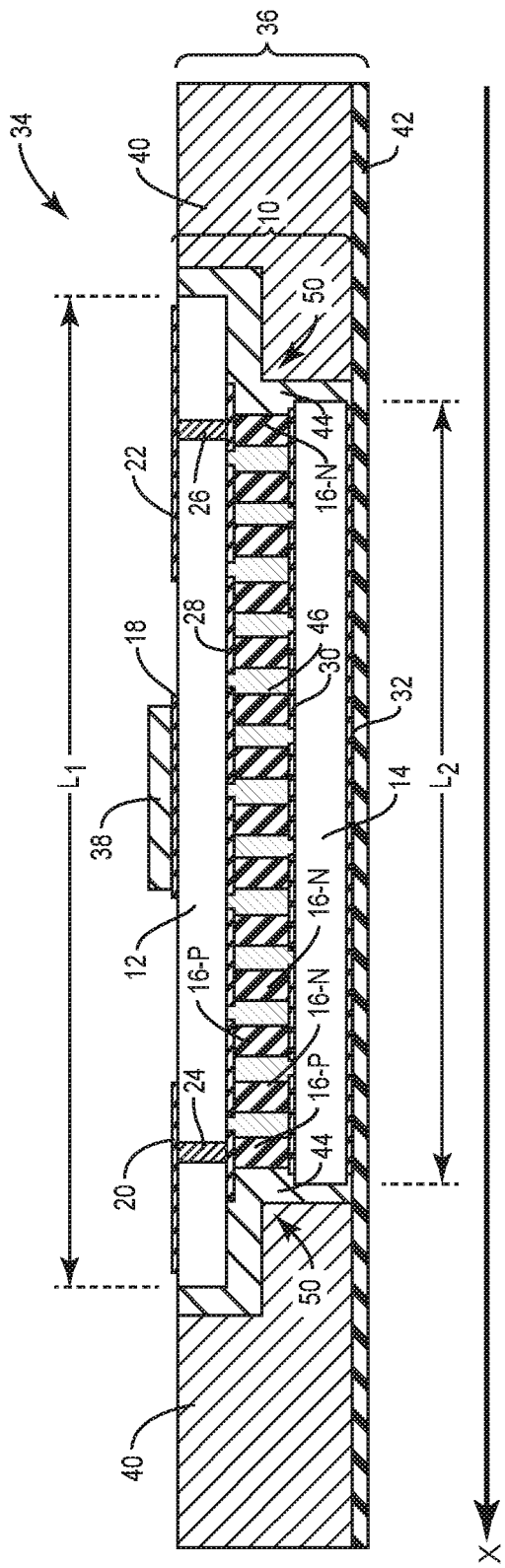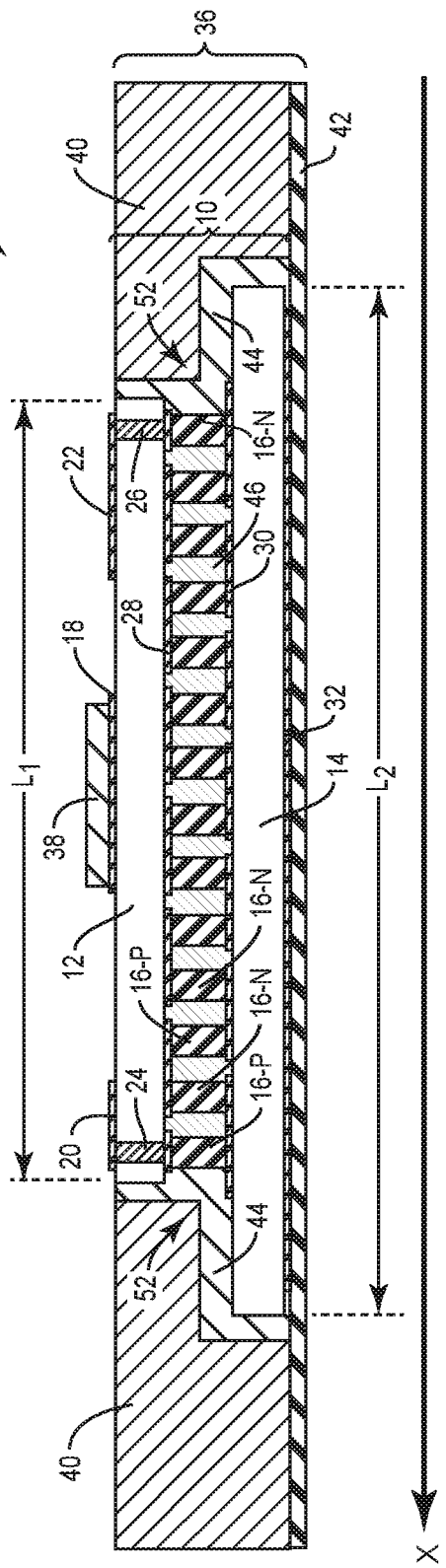

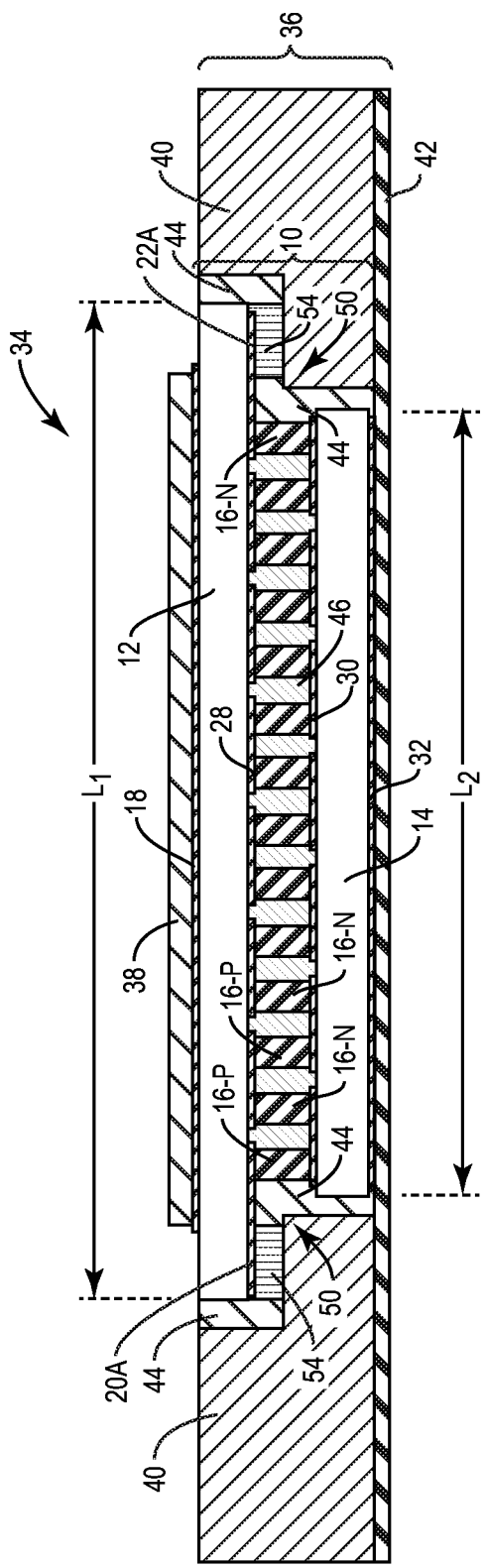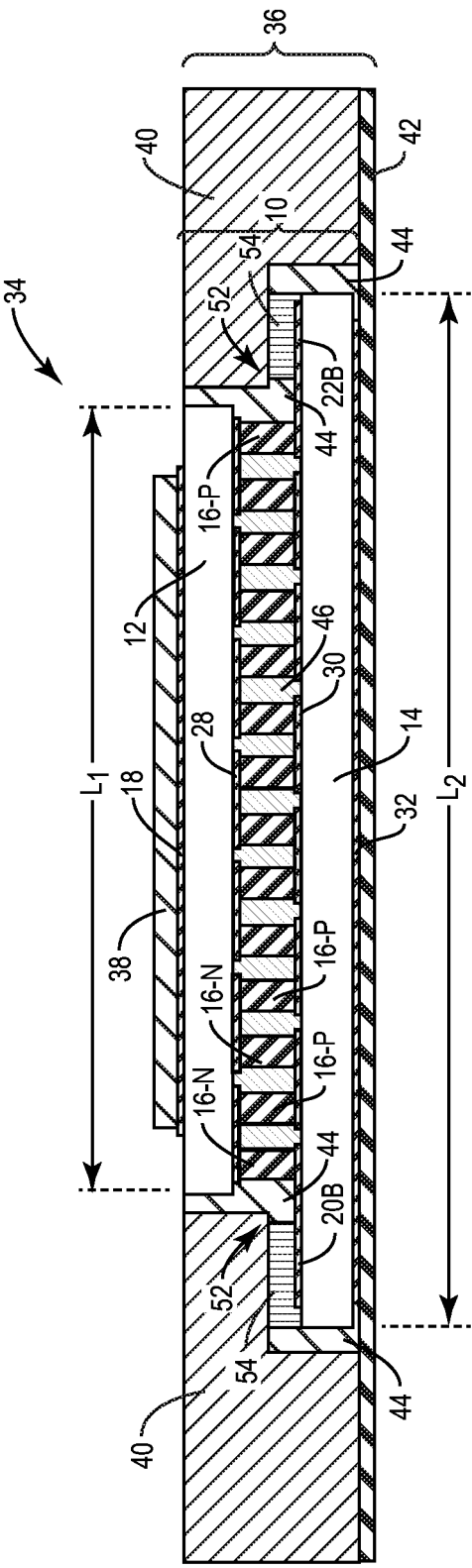
FIG. 4A
FIG. 4B

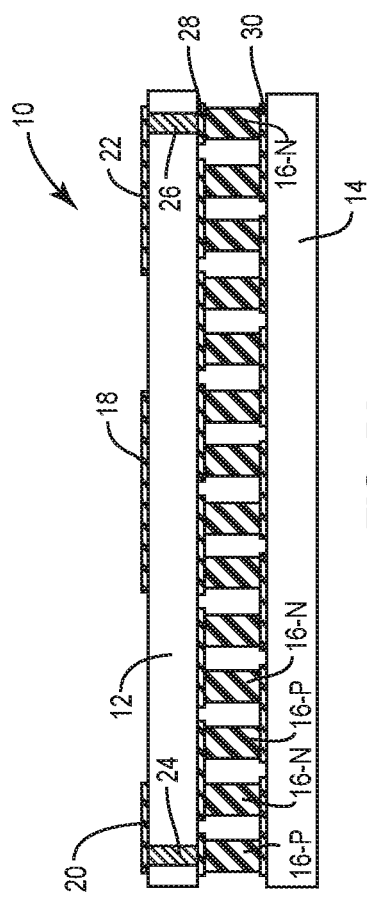
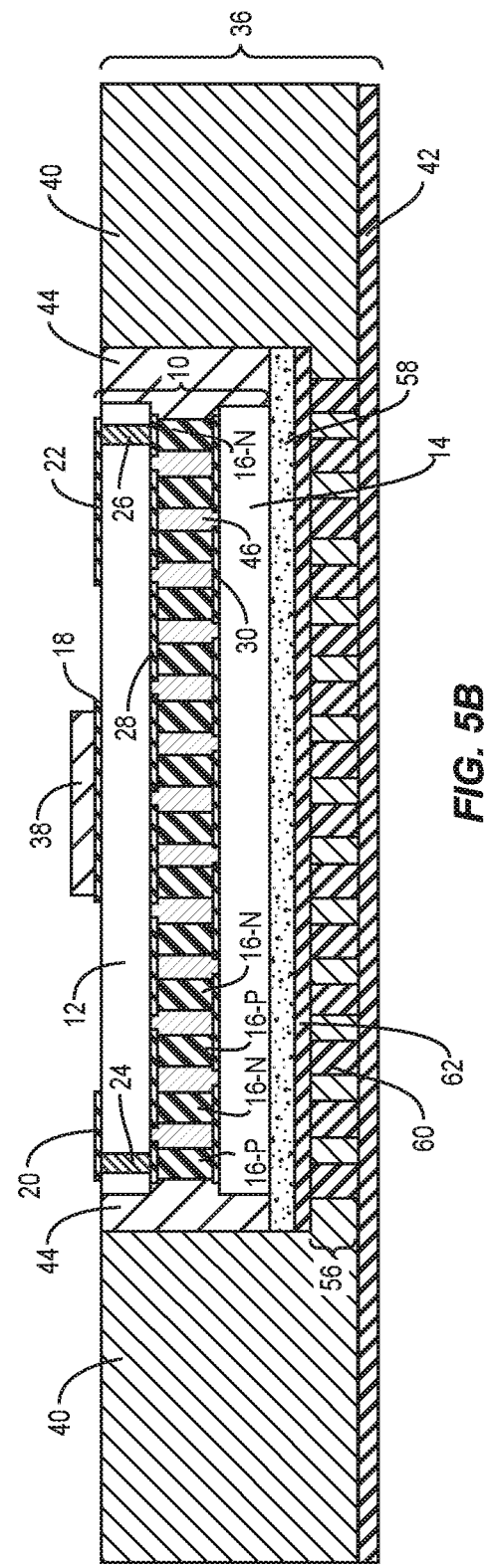

SUBSTRATE WITH EMBEDDED ACTIVE THERMOELECTRIC COOLER

RELATED APPLICATIONS

This application claims the benefit of provisional patent application Ser. No. 62/577,490, filed Oct. 26, 2017, the disclosure of which is hereby incorporated herein by reference in its entirety.

FIELD OF THE DISCLOSURE

The present disclosure relates to a substrate with improved thermal performance, and more particularly to a substrate with an embedded active thermoelectric cooler.

BACKGROUND

At an ever-increasing rate, high speed and high-performance transistors are more densely integrated on a die. The amount of heat generated by the die increases significantly due to the growth in density of transistors on die. If the heat generated by the die cannot be dissipated efficiently, the die may fail to operate or have a degraded operating performance. Accordingly, heat dissipation is an issue in densely integrated die, and efficient heat dissipation is highly desirable.

The die normally resides in or on a substrate and the substrate can affect the die performance in many ways. For instance, the heat produced by the die could be conducted away from their immediate vicinity through the substrate. Laminate materials are widely used in substrates, which are inexpensive and have a mature supply-base within the industry. However, the laminate materials have relatively poor thermal properties. On the other hand, ceramic and composite materials typically have better thermal characteristics, but they are more expensive.

To accommodate the increased heat generation of a densely integrated die, there remains a need for improved substrate designs. The substrate design will desirably be low in cost and smaller in size while providing superior thermal performance.

SUMMARY

The present disclosure relates to a substrate with improved thermal performance. The disclosed substrate includes a substrate body and a thermoelectric cooler (TEC) embedded in the substrate body. The substrate body has a top surface and a bottom surface that is opposite to the top surface of the substrate body. The TEC includes a top-side plate with an element-contact pad and a bottom-side plate. The top-side plate has a top surface and a bottom surface that is opposite to the top surface of the top-side plate, and the bottom-side plate has a top surface and a bottom surface that is opposite the top surface of the bottom-side plate. Herein, the top surface of the top-side plate faces a same direction as the top surface of the substrate body, and the bottom surface of the top-side plate faces the top surface of the bottom-side plate. The element-contact pad is on the top surface of the top-side plate and exposed to an external space of the substrate body. The element-contact pad is configured to accommodate attachment of a heat-generating electrical element. The top-side plate is in thermal contact with the heat-generating electrical element, and the bottom-side plate is in thermal contact with the bottom surface of the substrate body. The top-side plate is configured to change the temperature of the heat-generating electrical element, and the bottom-side plate is configured to transfer heat to or absorb heat from the bottom surface of the substrate body.

In one embodiment of the substrate, the top-side plate includes a number of first conductors, which are formed on the bottom surface of the top-side plate and separate from each other. The bottom-side plate includes a number of second conductors, which are formed on the top surface of the bottom-side plate and separate from each other. The TEC further includes a number of semiconductor pellets extending from the bottom surface of the top-side plate to the top surface of the bottom-side plate and configured to transmit the heat from the top-side plate to the bottom-side plate. Herein, the semiconductor pellets are electrically connected to each other in series via the first conductors and the second conductors.

In one embodiment of the substrate, the top-side plate further includes a first-contact pad, a second-contact pad, a first via, and a second via. The first-contact pad and the second-contact pad are on the top surface of the top-side plate and separate from each other. The first via extends from the top surface of the top-side plate to the bottom surface of the top-side plate, and electrically couples the first-contact pad to a corresponding first conductor. The second via extends from the top surface of the top-side plate to the bottom surface of the top-side plate, and electrically couples the second-contact pad to another corresponding first conductor.

In one embodiment of the substrate, the top-side plate further includes a first-contact pad and a second-contact pad, which are on the bottom surface of the top-side plate and separate from each other. The first-contact pad is electrically coupled to a corresponding first conductor, and the second-contact pad is electrically coupled to another corresponding first conductor.

In one embodiment of the substrate, the bottom-side plate further includes a first-contact pad and a second-contact pad, which are on the top surface of the bottom-side plate and separate from each other. The first-contact pad is electrically coupled to a corresponding second conductor, and the second-contact pad is electrically coupled to another corresponding second conductor.

In one embodiment of the substrate, the bottom-side plate further includes a bottom contact layer formed on the bottom surface of the bottom-side plate.

According to another embodiment, the substrate further includes a ground plane formed on the bottom surface of the substrate body. Herein, the ground plane is coupled to the bottom contact layer on the bottom surface of the bottom-side plate.

In one embodiment of the substrate, the semiconductor pellets includes a number of P-type pellets and a number of N-type pellets. Herein, the P-type pellets and the N-type pellets are formed alternately.

In one embodiment of the substrate, the TEC is embedded in the substrate body via a peripheral sealing material. The peripheral sealing material surrounds the TEC and fills gaps between the periphery of the TEC and the substrate body, such that the peripheral sealing material is configured to hold the TEC in place within the substrate body and ensure no moisture or gas are trapped within the TEC.

According to another embodiment, the substrate further includes an underfill material that fills gaps in between the semiconductor pellets. Herein, the underfill material and the peripheral sealing material are formed from a same material.

In one embodiment of the substrate, the top surface of the top-side plate is essentially flush with the top surface of the substrate body.

In one embodiment of the substrate, the top surface of the top-side plate is lower than the top surface of the substrate body to provide a recess, into which the heat-generating electrical element is assembled.

In one embodiment of the substrate, the bottom surface of the bottom-side plate is essentially flush with the bottom surface of the substrate body.

In one embodiment of the substrate, the bottom surface of the bottom-side plate is higher than the bottom surface of the substrate body.

According to another embodiment, the substrate further includes at least one thermally conductive structure that extends between the bottom surface of the bottom-side plate and the bottom surface of the substrate body. Herein, the at least one thermally conductive structure is thermally coupled to the bottom-side plate and transfers heat from the bottom-side plate toward the bottom surface of the substrate body. The at least one thermally conductive structure includes a number of thermal vias or a heat slug. In addition, the substrate further includes a ground plane formed on the bottom surface of the substrate body, such that the ground plane is coupled to the at least one thermally conductive structure.

In one embodiment of the substrate, the substrate body includes at least one stepped pocket structure formed in an internal portion of the substrate body, within which the TEC is received. Herein, the top-side plate has a longer length than the bottom-side plate.

In one embodiment of the substrate, the substrate body includes at least one reverse stepped pocket structure formed in an internal portion of the substrate body, within which the TEC is received. Herein, the top-side plate has a shorter length than the bottom-side plate.

In one embodiment of the substrate, the top-side plate has an essentially same length as the bottom-side plate.

In one embodiment of the substrate, the heat-generating electrical element is at least one of a die, an acoustic filter, a mechanical filter, a resonator, a passive die and a passive device.

According to another embodiment, the disclosed substrate includes a substrate body and a thermoelectric cooler (TEC) embedded in the substrate body. The substrate body has a top surface and a bottom surface that is opposite to the top surface of the substrate body. The TEC includes a top-side plate and a bottom-side plate. The top-side plate has a top surface and a bottom surface that is opposite the top surface of the top-side plate, and the bottom-side plate has a top surface and a bottom surface that is opposite the top surface of the bottom-side plate. Herein, the top surface of the top-side plate faces a same direction as the top surface of the substrate body, and the bottom surface of the top-side plate faces the top surface of the bottom-side plate. The top-side plate includes an element-contact pad, a first-contact pad, and a second-contact pad, which are on the top surface of the top-side plate and separate from each other. The element-contact pad is configured to accommodate attachment of a heat-generating electrical element. When the first-contact pad receives positive voltages and the second-contact pad receives non-positive voltages, the top-side plate is configured to absorb the heat from the heat-generating electrical element and the bottom-side plate is configured to transfer the heat to the bottom surface of the substrate body.

In one embodiment of the substrate, when the first-contact pad receives non-positive voltages and the second-contact pad receives positive voltages, the top-side plate is configured to provide the heat to the heat-generating electrical element.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A-2B show a package including an exemplary substrate, within which the TEC shown in FIG. 1D is embedded.

FIGS. 3A-3B show a package including an exemplary substrate, within which an alternative TEC is embedded.

FIGS. 4A-4B show a package including an exemplary substrate, within which an alternative TEC is embedded.

FIGS. 5A-5C show a package including an alternative substrate, within which the TEC shown in FIG. 1D is embedded.

Figure 1A:
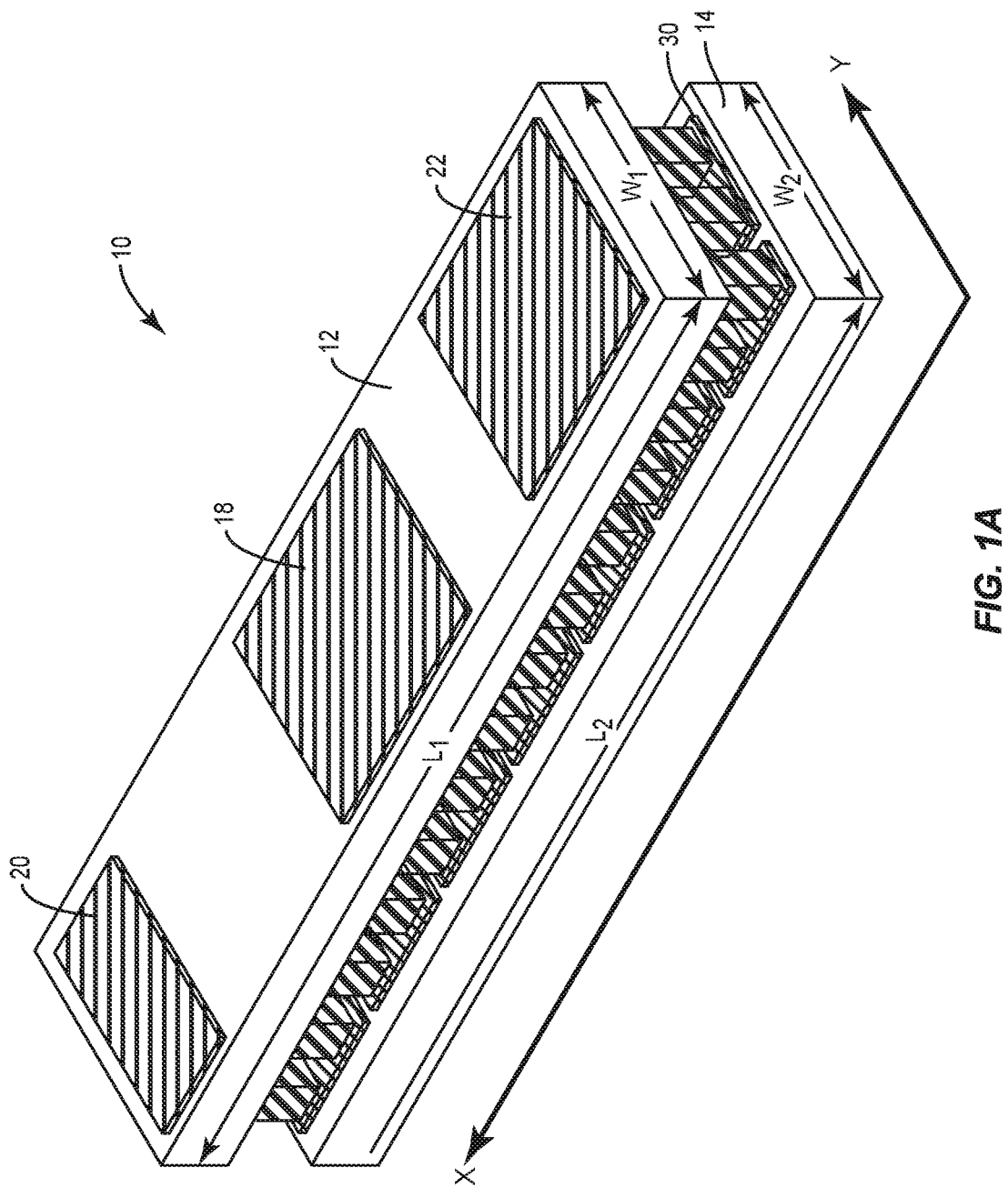
FIGS. 1A-1D shows an exemplary thermoelectric cooler (TEC) according to one embodiment of the present disclosure.

It will be understood that for clear illustrations, FIGS. 1-5C may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
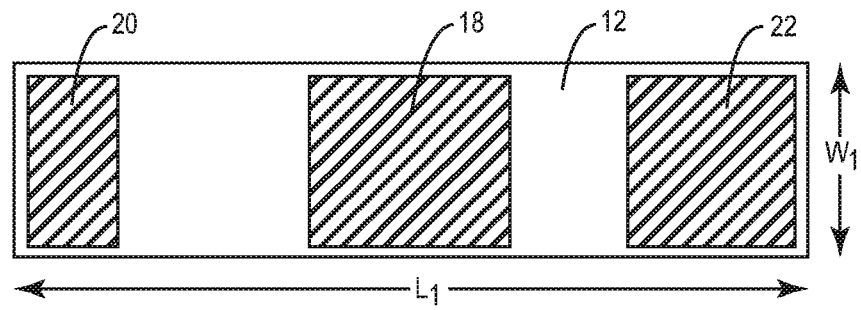
Figure 1C:
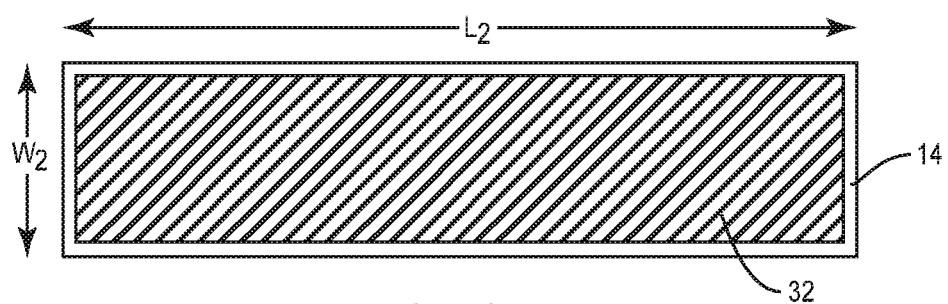
Figure 1D:
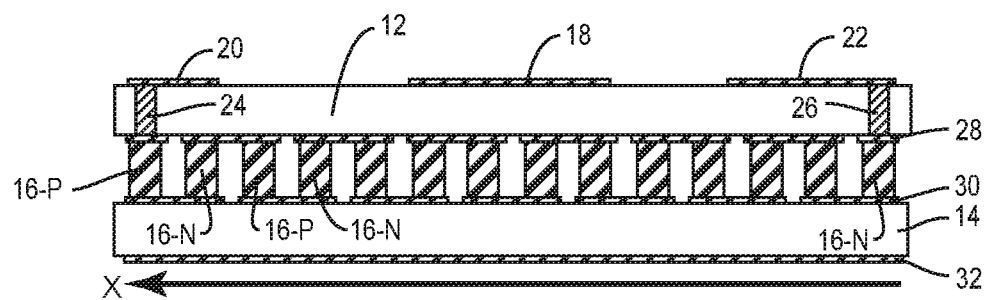

The present disclosure relates to a substrate with an embedded active thermoelectric cooler (TEC). FIGS. 1A-1D show an exemplary TEC 10 according to one embodiment of the present disclosure. FIG. 1A shows a 3D view of the TEC 10, FIG. 1B shows a top view of the TEC 10, FIG. 1C shows a bottom view of the TEC 10, and FIG. 1D shows a cross-section view of the TEC 10.

In detail, the TEC 10 includes a top-side plate 12 with a top surface and a bottom surface, a bottom-side plate 14 with a top surface and a bottom surface, and a number of semiconductor pellets 16. Herein, the top surface of the top-side plate 12 is opposite to the bottom surface of the top-side plate 12, the bottom surface of the top-side plate 12 faces the top surface of the bottom-side plate 14, and the top surface of the bottom-side plate 14 is opposite the bottom surface of the bottom-side plate 14. The semiconductor pellets 16 extend from the bottom surface of the top-side plate 12 towards the top surface of the bottom-side plate 14. In addition, the top-side plate 12 has a length L1 along an X axis and a width W1 along a Y axis that is orthogonal to the X axis. The bottom-side plate 14 has a length L2 along the X axis and a width W2 along the Y axis. In one embodiment, the length L1 of the top-side plate 12 is essentially the same as the length L2 of the bottom-side plate 14, and the width W1 of the top-side plate 12 is essentially the same as the width W2 of the bottom-side plate 14.

For the purpose of this illustration, the top-side plate 12 includes an element-contact pad 18, a first-contact pad 20, a second-contact pad 22, a first via 24, a second via 26, and a number of discrete first conductors 28 (only one first conductor is labeled with a reference number for clarity). The element-contact pad 18, the first-contact pad 20, and the second-contact pad 22 are on the top surface of the top-side plate 12 and separate from each other. The first conductors 28 are on the bottom surface of the top-side plate 12 and separate from each other. The first via 24 extends from the top surface of the top-side plate 12 to the bottom surface of the top-side plate 12, and electrically couples the first-contact pad 20 to a corresponding first conductor 28. The second via 26 extends from the top surface of the top-side plate 12 to the bottom surface of the top-side plate 12, and electrically couples the second-contact pad 22 to another corresponding first conductor 28. Herein, the element-contact pad 18 is configured to accommodate attachment of a heat-generating electrical element (shown in the following Figures and descriptions). The top-side plate 12 is in thermal contact with the attached heat-generating electrical element. In different applications, the TEC 10 may include more element-contact pads 18 to accommodate attachment of more electrical elements.

The bottom-side plate 14 includes a number of discrete second conductors 30 (only one second conductor is labeled with a reference number for clarity) and a bottom contact layer 32. The second conductors 30 are formed on the top surface of the bottom-side plate 14 and separate from each other, and the bottom contact layer 32 is formed on the bottom surface of the bottom-side plate 14. The semiconductor pellets 16 may include a number of P-type pellets 16-P and a number of N-type pellets 16-N, where the P-type pellets 16-P and the N-type pellets 16-N are placed alternately (only two P-type pellets and three N-type pellets are labeled with a reference number for clarity). The semiconductor pellets 16 extend from a bottom surface of the top-side plate 12 to the top surface of the bottom-side plate 14, and are electrically connected in series by the discrete first conductors 28 and the discrete second conductors 30.

In this embodiment, a P-type pellet 16-P is connected to the first-contact pad 20 through the first via 24 and one first conductor 28, while an N-type pellet 16-N is connected to the second-contact pad 22 through the second via 26 and another first conductor 28. When the first-contact pad 20 receives positive voltages from an external component (may be a substrate body 40 introduced in the following figures) and the second-contact pad 22 receives negative or zero (ground) voltages from the external component, the top-side plate 12 is configured to absorb the heat from the heat-generating electrical element attached to the element-contact pad 18, and the bottom-side plate 14 is configured to transfer the heat to the external component.

FIGS. 2A-2B show a package 34 including an exemplary substrate 36, within which the TEC 10 shown in FIG. 1D is embedded. Besides the substrate 36, the package 34 also includes a heat-generating electrical element 38. In different applications, the package 34 may include multiple heat-generating electrical elements 38, and the substrate 36 may include multiple TECs 10 to accommodate the multiple heat-generating electrical elements 38, or the TEC 10 may include multiple element-contact pads 18 to accommodate the multiple heat-generating electrical elements 38.

Figure 5C:
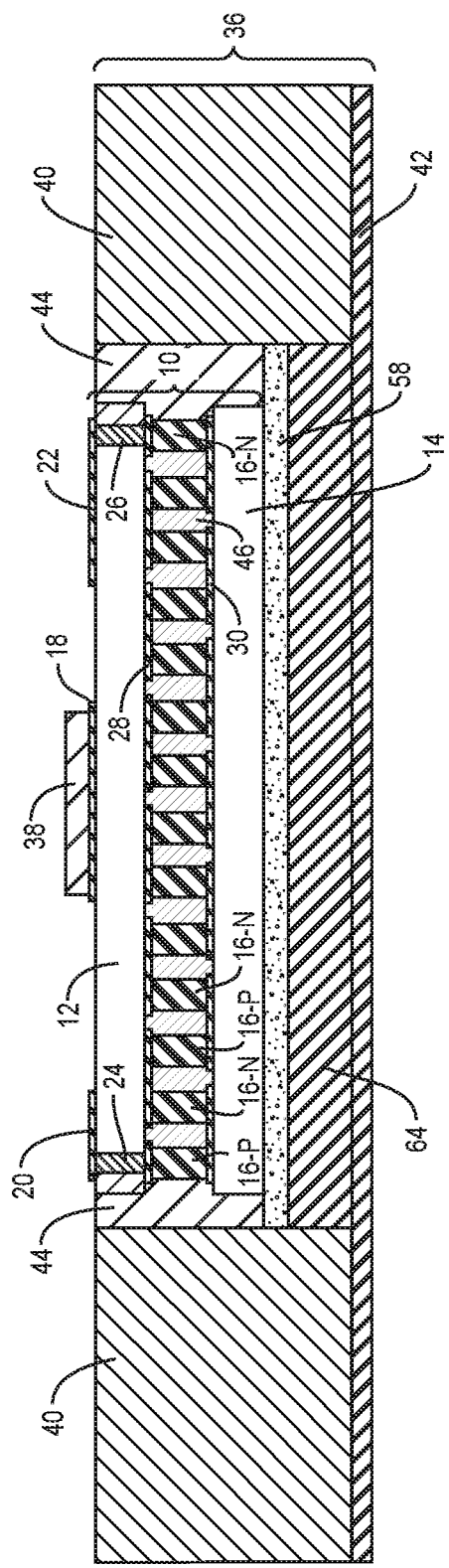

The substrate 36 includes the TEC 10, a substrate body 40, a ground plane 42, a peripheral sealing material 44, and an underfill material 46. The substrate body 40 has a top surface and a bottom surface that is opposite the top surface of the substrate body 40. The TEC 10 is embedded in the substrate body 40, such that the top surface of the top-side plate 12 faces a same direction as the top surface of the substrate body 40 and is exposed to the external space of the substrate body 40, and the bottom surface of the bottom-side plate 14 faces a same direction as the bottom surface of the substrate body 40. The bottom-side plate 14 is in thermal contact with the bottom surface of the substrate body 40. Herein, the top surface of the top-side plate 12 may be essentially flush with the top surface of the substrate body 40 (as shown in FIG. 2A), or the top surface of the top-side plate 12 may be lower than the top surface of the substrate body 40 to provide a recess 48 at top of the substrate 36 (as shown in FIG. 2B). In addition, the bottom surface of the bottom-side plate 14 may be essentially flush with the bottom surface of the substrate body 40 (as shown in FIGS. 2A and 2B) or the bottom surface of the bottom-side plate 14 may be higher than the bottom surface of the substrate body 40 (as shown in FIGS. 5B and 5C).

The ground plane 42 is formed on the bottom surface of the substrate body 40 and may be coupled to the bottom contact layer 32 on the button surface of the bottom-side plate 14. The peripheral sealing material 44 surrounds the TEC 10 and fills gaps between the periphery of the TEC 10 and the substrate body 40, such that the peripheral sealing material 44 is configured to hold the TEC 10 in place within the substrate body 40 and ensure no moisture or gas are trapped within the TEC 10. The peripheral sealing material 44 may be thermally conductive, but not electrically-conductive. The peripheral sealing material 44 may be formed of a suitable epoxy material or equivalent. The underfill material 46 fills gaps in between the semiconductor pellets 16 to provide mechanical support to the TEC 10. The underfill material 46 is thermally as well as electrically insulating. The underfill material 46 may be formed of epoxy resin materials. In some applications, the underfill material 46 may be omitted in the substrate 36 (not shown). If the underfill material 46 is included in the substrate 36, the underfill material 46 and the peripheral sealing material 44 may be formed of a same or different material.

The heat-generating electrical element 38 is attached to the element-contact pad 18, which is exposed at the top of the substrate 36. If the top surface of the top-side plate 12 is lower than the top surface of the substrate body 40, the heat-generating electrical element is assembled in the recess 48. The heat-generating electrical element 38 may be a die, an acoustic filter, a mechanical filter, a resonator, a passive die, or a passive device. Herein, the TEC 10 is configured to cool the heat-generating electrical element 38, and preferably refrigerate it to a temperature significantly lower than that of the ground plane 42. When the first-contact pad 20 receives positive voltages and the second-contact pad 22 receives negative or zero (ground) voltages, the top-side plate 12 is configured to absorb the heat from the heat-generating electrical element 38, the semiconductor pellets 16 are configured to transmit the heat from the top-side plate 12 to the bottom-side plate 14, and the bottom-side plate 14 is configured to transfer the heat to the bottom surface of the substrate body 40.

In one embodiment, to prevent the heat-generating electrical element 38 from getting too cold, the first-contact pad 20 may receive negative or zero (ground) voltages and the second-contact pad 22 may receive positive voltages. As such, the current polarity passing through the semiconductor pellets 16 is reversed. Herein, the top-side plate 12 is configured to provide the heat to the heat-generating electrical element 38, and the bottom-side plate 14 is configured to absorb the heat from the bottom surface of the substrate body (which is in thermal contact with external environment). Furthermore, by varying values of the current flow through the semiconductor pellets 16, the heat-generating electrical element 38 may keep a nearly constant temperature or keep within a desired temperature range.

Note that depending on the operating current and the configuration of the TEC 10, the heat generated by the TEC 10 may be several times greater than the heat produced by the heat-generating electrical element 38. The net effect is that in order to refrigerate the heat-generating electrical element 38, a much larger total amount of heat must be transferred to the bottom of the substrate.

In one embodiment, in order to provide superior support to the TEC 10, at least one stepped pocket structure 50 may be formed in an internal portion of the substrate body 40, within which the TEC 10 is received, as illustrated in FIG. 3A. Herein, the length L1 of the top-side plate 12 is longer than the length L2 of the bottom-side plate 14. In some applications, the top-side plate 12 may extend beyond both sides of the bottom-side plate 14 along the X axis. In some applications, the top-side plate 12 may only extend beyond one side of the bottom-side plate 14 along the X axis (not shown). It is desired that the at least one stepped pocket structure 50 of the substrate body 40 is underneath the extended portion(s) of the top-side plate 12. In another embodiment, at least one reverse stepped pocket structure 52 may be formed in the internal portion of the substrate body 40, within which the TEC 10 is received, as illustrated in FIG. 3B. Herein, the length L1 of the top-side plate 12 may be shorter than the length L2 of the bottom-side plate 14. In some applications, the bottom-side plate 14 may extend beyond both sides of the top-side plate 12 along the X axis. In some applications, the bottom-side plate 14 may only extend beyond one side of the top-side plate 12 along the X axis (not shown). The at least one reverse stepped pocket structure 52 of the substrate body 40 is above the extended portion(s) of the bottom-side plate 14. Notice that the width W1 of the top-side plate stays essentially the same as the width W2 of the bottom-side plate regardless of the length variations.

In some applications, the heat-generating electrical element 38 is relatively big, such that the element-contact pad 18 used for element attachment occupies most of the area of the top surface of the top-side-plate 12, as illustrated in FIGS. 4A and 4B. In one embodiment, the substrate body 14 includes two stepped pocket structures 50, and the top-side plate 12 may extend beyond both sides of the bottom-side plate 14 along the X axis. A first-contact pad 20A and a second-contact pad 22A may be formed on the bottom surface of the opposite extended portions of the top-side plate 12, respectively (shown in FIG. 4A). The first-contact pad 20A is electrically connected to a P-type pellet 16-P and the second-contact pad 22A is electrically connected to an N-type pellet 16-N. When the first-contact pad 20A receives positive voltages and the second-contact pad 22A receives negative or zero (ground) voltages, the top-side plate 12 is configured to absorb the heat from the heat-generating electrical element 38, the semiconductor pellets 16 are configured to transmit the heat from the top-side plate 12 to the bottom-side plate 14, and the bottom-side plate 14 is configured to transfer the heat to the bottom surface of the substrate body 40.

Herein, the first-contact pad 20A and the second-contact pad 22A are separate from each other. Since the first-contact pad 20A, the second-contact pad 22A, and the first conductors 28 are all formed at the bottom surface of the top-side-plate 12, there is no first/second via 24/26 needed to transmit the voltages from the top surface of the top-side-plate 12 to the bottom surface of the top-side-plate 12. The first-contact pad 20A, the second-contact pad 22A, and the first conductors 28 may be formed from a common metal layer.

In addition, the substrate 36 may further include an electrically-conductive material 54 formed between the first-contact pad 20A/the second-contact pad 22A and the corresponding stepped pocket structure 50 of the substrate body 40. As such, the first-contact pad 20A or the second-contact pad 22A may receive voltage signals from an appropriate metal layer (not shown), which is at the edge of the corresponding stepped pocket structure 50 and within the substrate body 40, through the electrically-conductive material 54. Herein, the peripheral sealing material 44 still surrounds the remaining portions of the TEC 10 and fills gaps between the periphery of the remaining portions of the TEC 10 and the substrate body 40.

In another embodiment, a first-contact pad 20B and a second-contact pad 22B may be formed on the top surface of the bottom-side-plate 14 (as shown in FIG. 4B). Herein, the substrate body 14 includes the reserve stepped pocket structures 52, and the bottom-side plate 14 may extend beyond both sides of the top-side plate 12 along the X axis. The first-contact pad 20B and the second-contact pad 22B are located at top surfaces of the opposite extended portions of the bottom-side plate 14, respectively. The first-contact pad 20B is electrically connected to an N-type pellet 16-N and the second-contact pad 22B is electrically connected to a P-type pellet 16-P. When the first-contact pad 20B receives positive voltages and the second-contact pad 22B receives negative or zero (ground) voltages, the top-side plate 12 is configured to absorb the heat from the heat-generating electrical element 38, the semiconductor pellets 16 are configured to transmit the heat from the top-side plate 12 to the bottom-side plate 14, and the bottom-side plate 14 is configured to transfer the heat to the bottom surface of the substrate body 40. Herein, the first-contact pad 20B and the second-contact pad 22B are separate from each other. The first-contact pad 20B, the second-contact pad 22B, and the second conductors 28 may be formed from a common metal layer.

In addition, the electrically-conductive material 54 is formed between the first-contact/second-contact pad 20B/22B and the corresponding reverse stepped pocket structure 52 of the substrate body 40. As such, the first-contact pad 20B or the second-contact pad 22B may receive voltage signals from an appropriate metal layer (not shown), which is at the edge of the corresponding reverse stepped pocket structures 52 and within the substrate body 40, through the electrically-conductive material 54. In this configuration, the electrically-conductive material 54 is not electrically connected to the ground plane 42. Herein, the peripheral sealing material 44 still surrounds the remaining portions of the TEC 10 and fills gaps between the periphery of the remaining portions of the TEC 10 and the substrate body 40.

As shown in FIGS. 2A-4B, the TEC 10 embedded in the substrate body 40 always includes the bottom contact layer 32 on the bottom surface of the bottom-side plate 14, which is directly coupled to the ground plane 42 formed on the bottom surface of the substrate body 40. In some applications, the TEC 10 may not include the bottom contact layer 32 (as shown in FIG. 5A), and is not directly coupled to the ground plane 42. As illustrated in FIG. 5B, the substrate body 40 is thicker than the TEC 10, and the bottom surface of the bottom-side plate 14 is higher than the bottom surface of the substrate body 40. Herein, the substrate 36 further includes a thermal via farm 56 and a thermally conductive adhesive 58. The thermal via farm 56 includes a number of thermal vias 60 and a via connector 62, and extends between the bottom surface of the bottom-side plate 14 of the TEC 10 and the ground plane 42 at the bottom surface of the substrate body 40. The thermal via farm 56 is thermally coupled to the TEC 10 through the thermally conductive adhesive 58. In particular, the thermally conductive adhesive 58 is formed between the bottom surface of the bottom-side plate 14 and the via connector 62. Each thermal via 60 is connected to the via connector 62, and extends from the via connector 62 towards the ground plane 42. In some applications, a heat slug 64 instead of the via farm 56 is included in the substrate 36. The heat slug 64 is formed below the TEC 10, and extends between the bottom surface of the bottom-side plate 14 and the ground plane 42. The heat slug 64 is thermally coupled to the TEC 10 through the thermally conductive adhesive 58. Herein, both the via farm 56 and the heat slug 64 are thermally conductive structures, which are thermally coupled to the bottom-side plate 14 of the TEC 10 and conduct heat transferred from the bottom-side plate 14 toward the ground plane 42 at the bottom surface of the substrate body 40.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
 a substrate body having a top surface and a bottom surface that is opposite the top surface of the substrate body, wherein the substrate body is made of a liquid crystal polymer material;
 a heat-generating electrical element; and
 a thermoelectric cooler (TEC) completely embedded in the substrate body, wherein:
  the substrate body surrounds the TEC and has zero contact with the TEC;
  the TEC comprises a top-side plate and a bottom-side plate;
  the top-side plate has a top surface and a bottom surface that is opposite the top surface of the top-side plate, and the bottom-side plate has a top surface and a bottom surface that is opposite the top surface of the bottom-side plate, wherein the top surface of the top-side plate faces a same direction as the top surface of the substrate body, and the bottom surface of the top-side plate faces the top surface of the bottom-side plate; and
  the top-side plate includes an element-contact pad, a first-contact pad, a second-contact pad, a first via, and a second via, wherein:
   the element-contact pad, the first-contact pad, and a second-contact pad are on the top surface of the top-side plate, separate from each other, and exposed to an external space of the substrate body;
   the first via extends from the top surface of the top-side plate to the bottom surface of the top-side plate, and is electrically coupled to the first-contact pad that is configured to receive a first voltage, while the second via extends from the top surface of the top-side plate to the bottom surface of the top-side plate, and is electrically coupled to the second-contact pad that is configured to receive a second voltage, wherein the first voltage and the second voltage are different;
   the element-contact pad is configured to accommodate attachment of the heat-generating electrical element;

the top-side plate is in thermal contact with the heat-generating electrical element, and the bottom-side plate is in thermal contact with the bottom surface of the substrate body;

the heat-generating electrical element is horizontally confined within the top-side plate;

the top surface of the top-side plate is lower than the top surface of the substrate body to provide a recess, into which the heat-generating electrical element is assembled; and the top-side plate is configured to change temperature of the heat-generating electrical element, and the bottom-side plate is configured to transfer heat to or absorb heat from the bottom surface of the substrate body.

2. The apparatus of claim 1 wherein when the first voltage is a positive voltage and the second voltage is a non-positive voltage, the top-side plate is configured to absorb heat from the heat-generating electrical element and the bottom-side plate is configured to transfer the heat to the bottom surface of the substrate body.

3. The apparatus of claim 1 wherein when the first voltage is a non-positive voltage and the second voltage is a positive voltage, the top-side plate is configured to provide heat to the heat-generating electrical element and the bottom-side plate is configured to absorb the heat from the bottom surface of the substrate body.

4. The apparatus of claim 1 wherein the top surface of the top-side plate is essentially flush with the top surface of the substrate body.

5. The apparatus of claim 1 wherein the bottom surface of the bottom-side plate is essentially flush with the bottom surface of the substrate body.

6. The apparatus of claim 1 wherein:
the substrate body includes at least one stepped pocket structure formed in an internal portion of the substrate body, within which the TEC is received; and
the top-side plate has a longer length than the bottom-side plate.

7. The apparatus of claim 1 wherein:
the substrate body includes at least one reverse stepped pocket structure formed in an internal portion of the substrate body, within which the TEC is received; and
the top-side plate has a shorter length than the bottom-side plate.

8. The apparatus of claim 1 wherein the top-side plate has an essentially same length as the bottom-side plate.

9. The apparatus of claim 1 wherein the heat-generating electrical element is at least one of a die, an acoustic filter, a mechanical filter, a resonator, a passive die, and a passive device.

10. The apparatus of claim 1 wherein the first-contact pad and the second-contact pad are not electrically connected to the heat-generating electrical element.

11. The apparatus of claim 1 wherein the heat-generating electrical element is confined by the top-side plate of the TEC, such that the heat-generating electrical element does not extend horizontally over the substrate body.

12. The apparatus of claim 1 wherein:
the top-side plate comprises a plurality of first conductors, which are formed on the bottom surface of the top-side plate and separate from each other;

the bottom-side plate comprises a plurality of second conductors, which are formed on the top surface of the bottom-side plate and separate from each other; and the TEC further comprises a plurality of semiconductor pellets extending from the bottom surface of the top-side plate to the top surface of the bottom-side plate and configured to transmit the heat from the top-side plate to the bottom-side plate, wherein the plurality of semiconductor pellets are electrically connected to each other in series via the plurality of first conductors and the plurality of second conductors.

13. The apparatus of claim 12 wherein:
the first-contact pad is electrically connected to a corresponding first conductor by the first via; and
the second-contact pad is electrically connected to another corresponding first conductor by the second via.

14. The apparatus of claim 12 wherein the bottom-side plate further comprises a bottom contact layer formed on the bottom surface of the bottom-side plate.

15. The apparatus of claim 14 further comprises a ground plane formed on the bottom surface of the substrate body, wherein the ground plane is coupled to the bottom contact layer on the bottom surface of the bottom-side plate.

16. The apparatus of claim 12 wherein the plurality of semiconductor pellets comprises a plurality of P-type pellets and a plurality of N-type pellets, wherein the plurality of P-type pellets and the plurality of N-type pellets are formed alternately.

17. The apparatus of claim 12 wherein the TEC is embedded in the substrate body via a peripheral sealing material, wherein the peripheral sealing material surrounds the TEC and fills gaps between the periphery of the TEC and the substrate body, such that the peripheral sealing material is configured to hold the TEC in place within the substrate body and ensure no moisture or gas is trapped within the TEC.

18. The apparatus of claim 17 further comprising an underfill material that fills gaps in between the plurality of semiconductor pellets.

19. The apparatus of claim 18 wherein the peripheral sealing material and the underfill material are formed from a same material.

20. The apparatus of claim 1 wherein the bottom surface of the bottom-side plate is higher than the bottom surface of the substrate body.

21. The apparatus of claim 20 further comprising at least one thermally conductive structure that extends between the bottom surface of the bottom-side plate and the bottom surface of the substrate body, wherein the at least one thermally conductive structure is thermally coupled to the bottom-side plate and conducts heat transferred from the bottom-side plate toward the bottom surface of the substrate body.

22. The apparatus of claim 21 further comprises a ground plane formed on the bottom surface of the substrate body, wherein the ground plane is coupled to the at least one thermally conductive structure.

23. The apparatus of claim 21 wherein the at least one thermally conductive structure comprises a plurality of thermal vias.

24. The apparatus of claim 21 wherein the at least one thermally conductive structure comprises a heat slug.

* * * * *